(12) United States Patent
Rao et al.

(10) Patent No.: US 7,230,462 B2
(45) Date of Patent: Jun. 12, 2007

(54) CLOCK SIGNAL SYNCHRONIZING DEVICE, AND CLOCK SIGNAL SYNCHRONIZING METHOD

(75) Inventors: Rajashekhar Rao, München (DE); Alessandro Minzoni, Morrisville, NC (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/971,762

(22) Filed: Oct. 25, 2004

(65) Prior Publication Data

US 2005/0111291 A1 May 26, 2005

(30) Foreign Application Priority Data

Oct. 23, 2003 (DE) ................ 103 49 466

(51) Int. Cl.
*H03L 7/06* (2006.01)
(52) U.S. Cl. .............. 327/158; 327/149; 327/161
(58) Field of Classification Search ........... 327/147, 327/149, 150, 153, 156, 158, 161, 261, 264
See application file for complete search history.

(56) References Cited

U.S. PATENT DOCUMENTS

| 5,744,991 | A | * | 4/1998 | Jefferson et al. ............ 327/158 |
| 5,815,016 | A | * | 9/1998 | Erickson ..................... 327/158 |
| 6,094,078 | A | * | 7/2000 | Suzuki ....................... 327/156 |
| 6,100,733 | A | * | 8/2000 | Dortu et al. ................. 327/149 |
| 6,229,864 | B1 | * | 5/2001 | DuFour ....................... 375/375 |
| 6,326,826 | B1 | * | 12/2001 | Lee et al. ................... 327/161 |
| 6,392,495 | B1 | * | 5/2002 | Larsson ........................ 331/11 |
| 6,762,633 | B2 | * | 7/2004 | Lee ............................. 327/158 |
| 6,774,687 | B2 | * | 8/2004 | Gomm et al. ................ 327/158 |
| 2002/0041196 | A1 | | 4/2002 | Demone et al. | |

* cited by examiner

*Primary Examiner*—Timothy P. Callahan
*Assistant Examiner*—Hai L. Nguyen
(74) *Attorney, Agent, or Firm*—Morrison & Foerster LLP

(57) ABSTRACT

The invention relates to a clock signal synchronizing method, and to a clock signal synchronizing device for synchronizing clock signals. In particular the device and method synchronizes a clock signal used internally in a memory chip with a clock signal input externally into the memory chip.

9 Claims, 5 Drawing Sheets

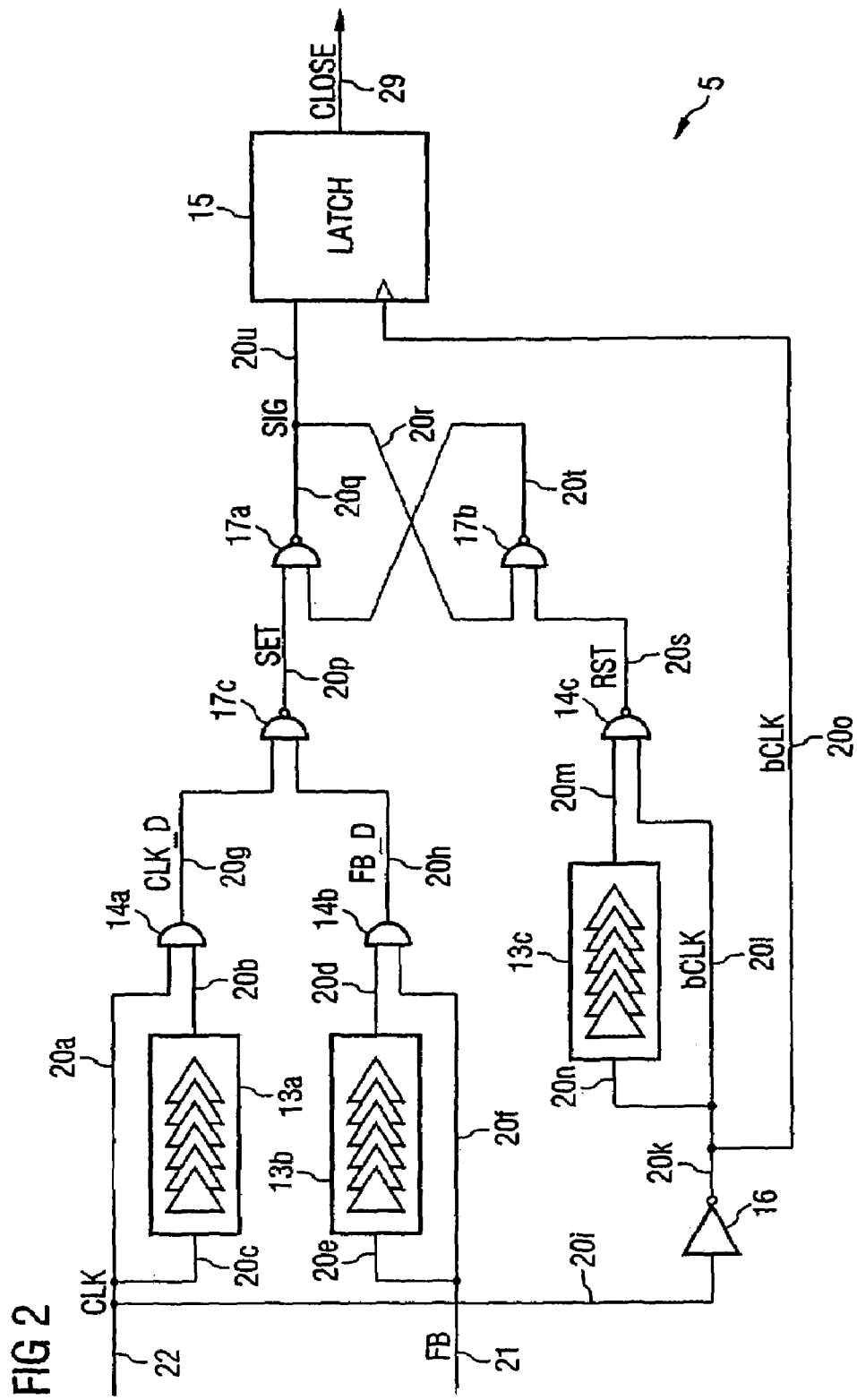

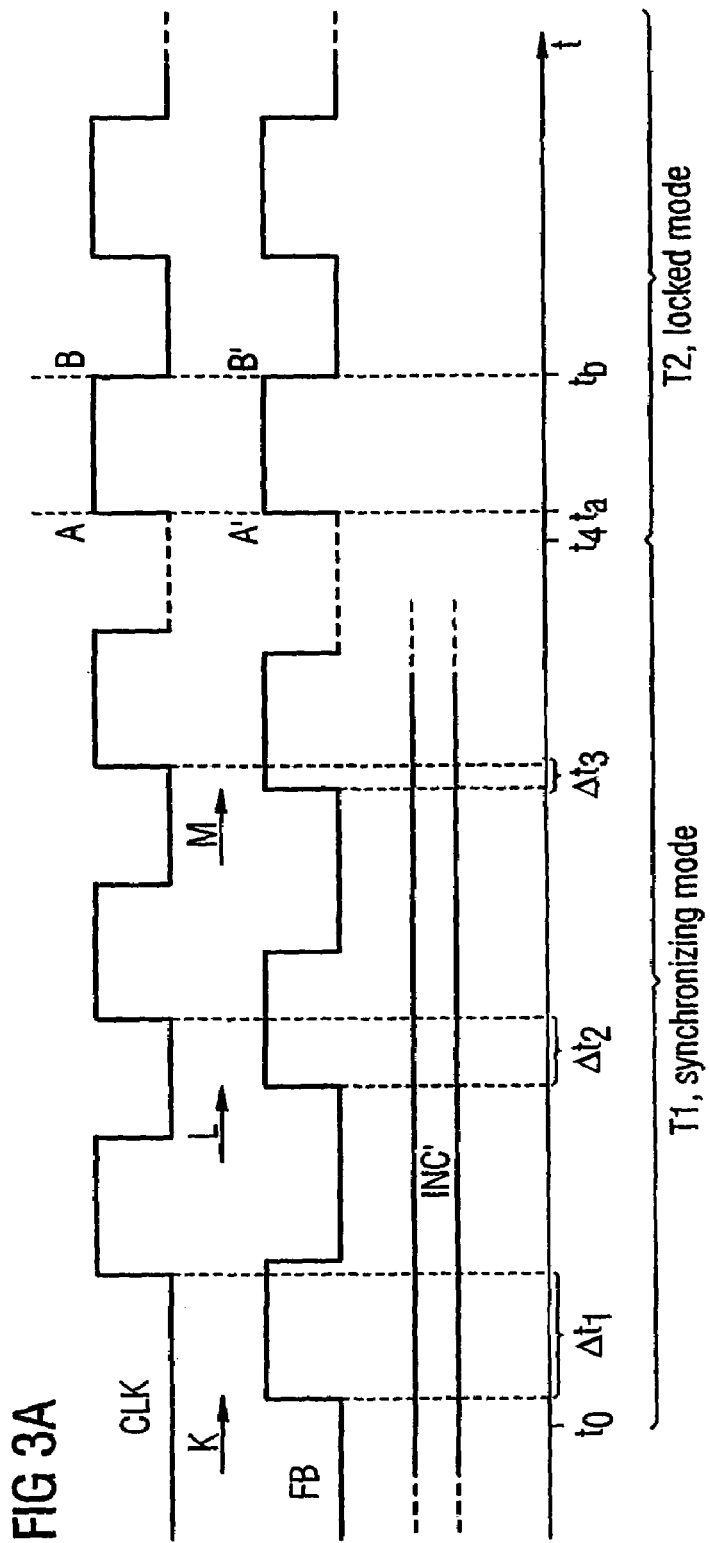

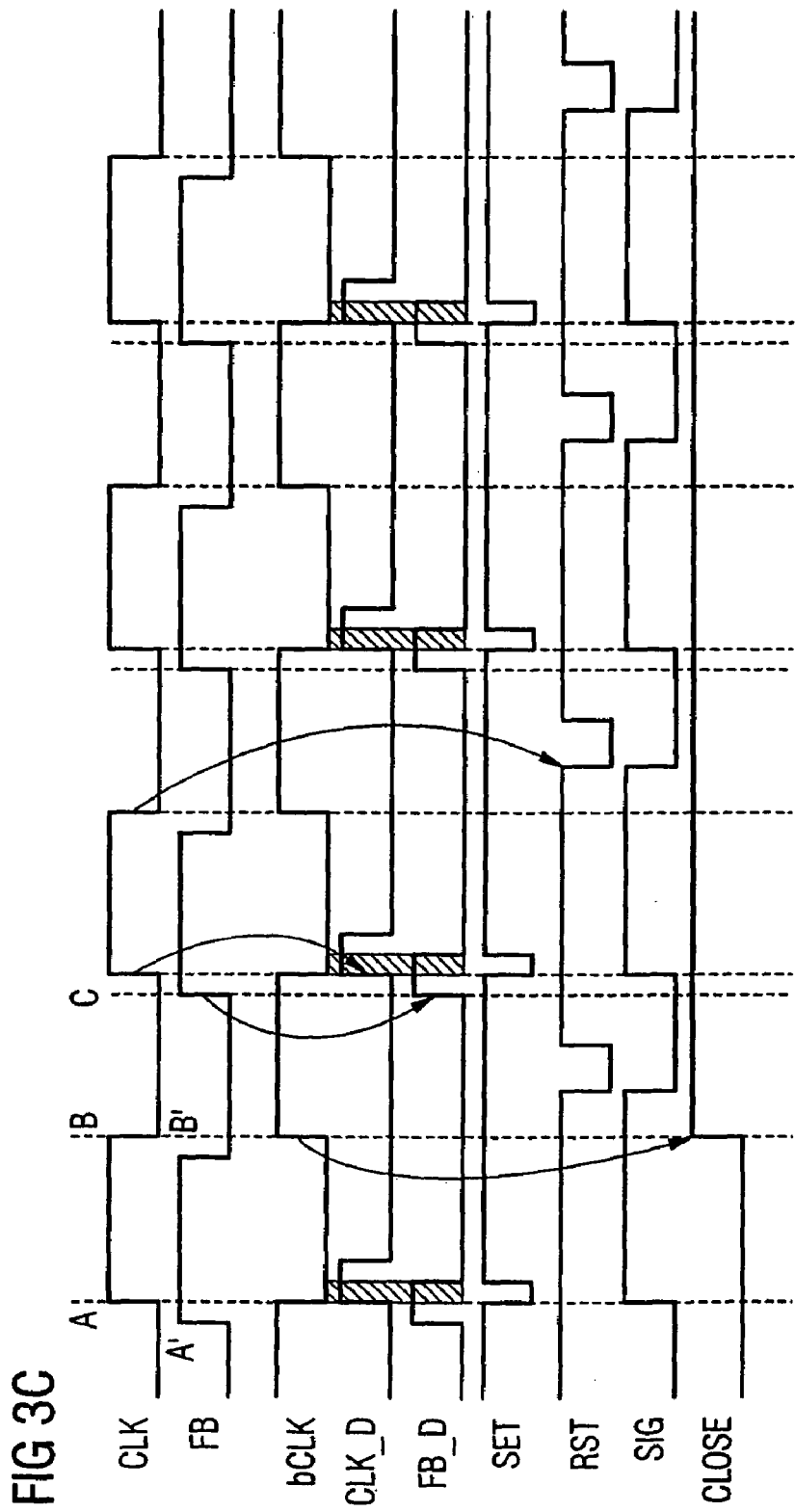

CLOCK SIGNAL SYNCHRONIZING DEVICE, AND CLOCK SIGNAL SYNCHRONIZING METHOD

CLAIM FOR PRIORITY

This application claims priority to German Application No. 10349466.9 filed Oct. 23, 2003, which is incorporated herein, in its entirety, by reference.

TECHNICAL FIELD OF THE INVENTION

The invention relates to a clock signal synchronizing device, in particular for synchronizing a clock signal used internally in a memory chip with a clock signal input externally into the memory chip, as well as to a clock signal synchronizing method.

BACKGROUND OF THE INVENTION

With semiconductor devices, in particular with memory devices such as DRAMS (DRAM=Dynamic Random Access Memory or dynamic read-write memory, respectively)—based e.g. on CMOS technology—so-called clock signals are used for coordinating the processing or advancing, respectively, of the data with respect to time.

In the case of conventional semiconductor devices, an individual clock signal—that is applied at an individual line—is, in general, used (i.e. a so-called "single-ended" clock signal).

The data may then be advanced e.g. at the rising clock edge of the individual clock signal (or, alternatively, e.g. at the falling clock edge of the individual clock signal).

Furthermore, so called DDR devices, in particular DDR-DRAMs (DDR-DRAM=Double Data Rate-DRAM or DRAM with double data rate, respectively), are already known in prior art.

In the case of DDR devices—instead of one individual clock signal applied at an individual line ("single-ended" clock signal)—two differential, oppositely-inverse clock signals applied on two separate lines are used.

Whenever e.g. the first clock signal of the two clock signals changes from a state "logically high" (e.g. a high voltage level) to a state "logically low" (e.g. a low voltage level), the second clock signal changes—substantially simultaneously—its state from "logically low" to "logically high" (e.g. from a low to a high voltage level).

Vice versa, whenever the first clock signal changes from a state "logically low" (e.g. a low voltage level) to a state "logically high" (e.g. a high voltage level), the second clock signal (again substantially simultaneously) changes its state from "logically high" to "logically low" (e.g. from a high voltage level to a low voltage level).

In DDR devices, the data are, in general, advanced both at the rising edge of the first clock signal and at the rising edge of the second clock signal (or both at the falling edge of the first clock signal and at the falling edge of the second clock signal, respectively).

Thus, advancing of the data in a DDR device is performed more frequently or more quickly, respectively (in particular twice as frequent or twice as quick, respectively) than with corresponding, conventional devices with an individual or "single-ended" clock signal, i.e., the data rate is higher, in particular twice as high, as with corresponding, conventional devices.

The clock signal used—internally—in the device for coordinating the processing or advancing, respectively, of the data with respect to time ("DQS signal or "data strobe" signal, respectively) (or—when differential, oppositely-inverse clock signals are used—the internal clock signal DQS and the clock signal BDQS that is oppositely-inverse to the clock signal DQS) must be synchronous to a clock signal ("CLK signal or "clock" signal, respectively) input externally into the device (or synchronous to the differential clock signals CLK, BCLK input externally into the device, respectively).

The external clock signal(s) CLK, BCLK is/are generated by an appropriate clock signal generator connected with the device.

For synchronizing the internally generated clock signal DQS or the internally generated clock signals DQS, BDQS, respectively, with the external clock signal(s) CLK, BCLK, a clock signal synchronizing device, e.g. a DLL circuit (DLL=Delay-Locked-Loop) is used. Such a circuit is, for instance, known from EP 964 517.

A clock signal synchronizing device may, for instance, include a first delay module into which the external clock signal(s) CLK, BCLK is/are input, and which charges the input external clock signal(s) CLK, BCLK—as a function of a control signal output by a phase comparator—with a variable control time $t_{var}$ that is adjustable by the control signal.

The signal(s) output by the first delay module may be used—internally—in the device for coordinating the processing or advancing, respectively, of the data with respect to time (i.e. as—internal—clock signal(s) DQS or BDQS, respectively).

The signal DQS output by the first delay module is supplied to a second delay module that charges the input signal DQS with a—fixed—delay time $t_{const}$ corresponding approximately to the sum of the signal delays caused by the receiver(s) ("receiver delay"), the respective data path ("data path delay"), and the off-chip driver(s) ("OCD delay").

The signal output by the second delay module (FB signal or "feedback signal", respectively) is supplied to the above-mentioned phase comparator; there, the phasing of the FB signal is compared to that of the CLK signal that has also been input into the phase comparator. Depending on whether the phase of the FB signal hurries ahead or runs after that of the CLK signal, the phase comparator outputs—as a control signal for the above-mentioned first delay module—an incrementing signal (INC signal) or a decrementing signal (DEC signal), which result in that the delay $t_{var}$ of the CLK signal effected by the first delay module is—in the case of an INC signal—increased, or—in the case of a DEC signal—decreased, so that the CLK signal and the FB signal are finally synchronized, i.e. the clock signal synchronizing device is "locked".

In the locked state of the clock signal synchronizing device, a filter—connected between the phase comparator and the first delay module—may be activated, which forwards the INC or DEC signal to the first signal delay module only when for a particular number of successive clocks—e.g. defined by the clock signals CLK, BCLK—(e.g. 16 successive clocks) one and the same signal is output by the phase comparator (e.g. for 16 successive clocks an INC signal, or for 16 successive clocks a DEC signal).

By that—in the locked state of the clock signal synchronizing device—jitter in the clock signal DQS output by the clock signal synchronizing device may be avoided, while—from time to time (namely, when the INC or DEC signal is forwarded from the filter to the first signal delay module)—resynchronizing of the clock signal DQS with respect to the clock signal CLK can nevertheless be ensured.

However, e.g. when—during the locked state of the clock signal synchronizing device—the frequency of the CLK signal changes, it may take a relatively long time until the CLK signal and the DQS signal are synchronized again.

SUMMARY OF THE INVENTION

The present invention provides a novel clock signal synchronizing device and a novel clock signal sychronizing method. In particular a device and a method by which the above-described drawbacks can be remedied at least partially are provided.

In accordance with a basic idea of the invention, a clock signal synchronizing device for synchronizing clock signals (CLK) is provided. The device includes:

delay module with a delay time ($t_{var}$) that is variably controllable by a control device, into which a clock signal (CLK) or a signal obtained therefrom, is input, is charged with the variably controllable delay time ($t_{var}$), and is output as a delayed clock signal (DQS), a phase comparator for comparing the phase of the clock signal (CLK), or of the signal obtained therefrom, with the phase of the delayed clock signal (DQS) or of a signal (FB) obtained therefrom, wherein a device is provided for determining whether a clock edge of the delayed clock signal (DQS) output by the delay module, or of the signal (FB) obtained therefrom, lies within a predetermined time frame ($\Delta T$) before or after a corresponding clock edge of the clock signal (CLK), or of the signal obtained therefrom.

By that, the delay module can detect whether the delayed clock signal (DQS), or the signal (FB) obtained therefrom, is synchronized relatively well or relatively poorly with the clock signal (CLK), or the signal obtained therefrom.

Depending thereon—in particular in a "locked state" of the clock signal synchronizing device—a more or less quick clock resynchronization may then be performed in a variable manner.

BRIEF DESCRIPTION OF THE DRAWINGS

The invention can be understood by reference to the Detailed Description of the Invention when taken together with the attached drawings wherein:

FIG. 2 is a schematic detail representation of a control device used with the clock signal synchronizing device of FIG. 1 for controlling the clock signal synchronizing process, in particular the filter;

FIG. 3a are time flow diagrams of the FB and CLK signals input into the control device illustrated in FIG. 2, in a first and second mode of the clock signal synchronizing device;

FIG. 3c are time flow diagrams of the FB and CLK signals input into the control device illustrated in FIG. 2, the signals generated in the control device, and the control signal (CLOSE signal) output by the control device and used for controlling the clock signal synchronizing process, with a relatively good synchronization of the FB and CLK signals.

DETAILED DESCRIPTION OF THE INVENTION

Figure 1:
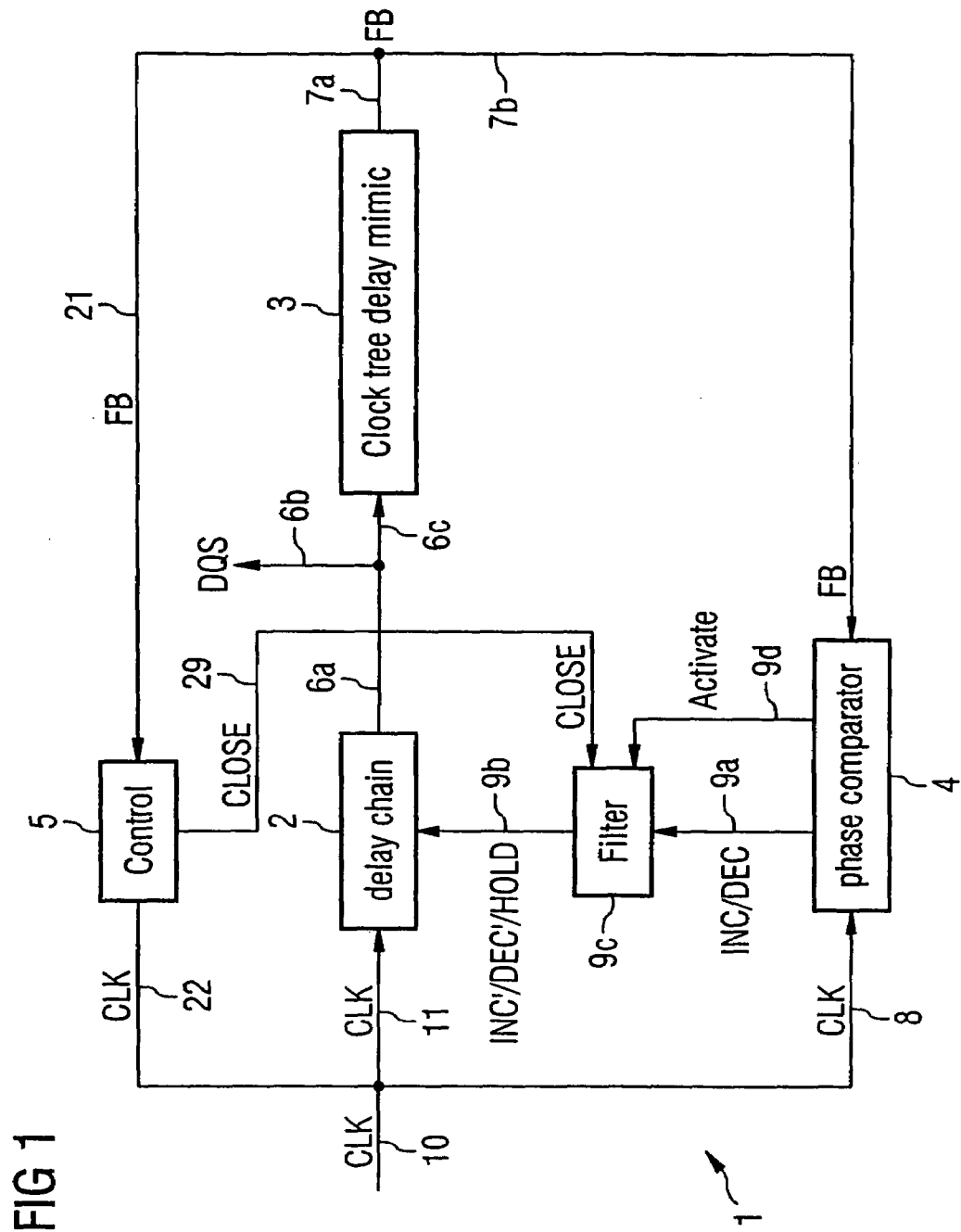
FIG. 1 is a schematic representation of a clock signal synchronizing device according to an embodiment of the invention.

FIG. 1 shows a schematic representation of a clock signal synchronizing device 1 in accordance with an embodiment of the invention.

It includes—correspondingly similar to conventional clock signal synchronizing devices—first delay module 2, second delay module 3, a phase comparator 4, and filter 9c connected between the phase comparator 4 and the first delay module 2, as well as—different from conventional clock signal synchronizing devices, and as will be explained in detail in the following—a specifically designed control device 5 used for controlling the clock signal synchronizing process, in particular the filter 9c.

The clock signal synchronizing device 1 may e.g. be provided on a semiconductor device, in particular a memory device such as a DRAM (DRAM=Dynamic Random Access Memory or dynamic write-read memory, respectively) based, for instance, on CMOS technology, e.g. a DDR-DRAM (DDR-DRAM=Double Data Rate-DRAM or DRAM with double data rate, respectively).

The corresponding semiconductor device includes an —external—connection (e.g. an appropriate pad or an appropriate pin, respectively) at which—for coordinating the processing or advancing, respectively, of the data in the semiconductor device with respect to time—an external clock signal CLK is applied by an external clock signal generator.

Alternatively, the device may include an appropriate— further—external connection (e.g. an appropriate further pad or an appropriate further pin, respectively) at which a clock signal BCLK that is inverse to the above-mentioned clock signal CLK is applied (i.e. so-called "differential" clock signals CLK, BCLK may be used).

Internally in the device, the data may, for instance, be advanced at the rising (or, alternatively, at the falling) clock edge of the above-mentioned clock signal CLK (or—more exactly—of an internal DQS clock signal obtained therefrom), or—when differential clock signals CLK and BCLK are used (or—more exactly—differential, internal clock signals DQS and BDQS obtained therefrom)—in general, both at the rising edge of the CLK clock signal and at the rising edge of the BCLK clock signal (or both at the rising edge of the DQS signal and at the rising edge of the BDQS signal) (or at the falling clock edges of the corresponding signals, respectively)).

As is illustrated in FIG. 1, the CLK signal—applied at the corresponding connection of the semiconductor device—is, via a line 10 and a line 11 connected thereto, supplied to the first delay module 2 provided in the clock signal synchronizing device 1.

In the first delay module 2 ("delay chain" or "delay line", respectively), the CLK signal is—as a function of a control signal INC or DEC, respectively, output by the phase comparator 4 (or—more exactly—of a control signal INC' or DEC', respectively, obtained therefrom and output by the filter 9c) charged with a variable delay time $t_{var}$ that is adjustable by the control signal or a control device receiving same, respectively.

The signal DQS that is output by the first delay module 2 at a line 6a and a line 6b connected thereto, and that is delayed vis-à-vis the CLK signal by the above-mentioned variable delay time $t_{var}$ (or, additionally, a signal BDQS that is inverse to the signal DQS) may, as has already been indicated above, be used—internally—in the device for coordinating the processing or advancing, respectively, of the data with respect to time (i.e. as—internal—clock signal(s) DQS or BDQS, respectively).

The BDQS signal may, for instance, be generated from the DQS signal—by inverting—, or may, for instance, be generated separately (e.g. from the BCLK signal, by using a clock signal synchronizing device corresponding to the clock signal synchronizing device 1 illustrated in FIG. 1).

As results further from FIG. 1, the signal DQS output by the first delay module 2 is—via the above-mentioned line 6a and a line 6c connected therewith—(additionally also) supplied to the above-mentioned second delay module 3 ("clock tree delay mimic") which charges the input signal DQS with a—fixed—delay $t_{const}$ corresponding, for instance, roughly to the sum of the signal delays caused by the receiver(s) ("receiver delay"), the respective data path ("data path delay"), and the off-chip driver(s) ("OCD delay").

The signal (FB signal or "feedback signal", respectively) output by the second delay module 3 at a line 7a and delayed vis-à-vis the DQS signal by the above-mentioned fixed delay time $t_{const}$ is, via a line 7b—that is connected with the line 7a—, supplied to a first input of the phase comparator 4, and via a line 21—that is also connected with the line 7a—(and as will be explained in detail in the following) to the control device 5 ("control").

As results further from FIG. 1, the CLK signal applied at the line 10 is—via a line 8 that is connected with the line 10—supplied to a (further) input of the phase comparator 4, and via a line 22—that is also connected with the line 10—(and as will be explained in detail in the following) to the control device 5.

In the phase comparator 4—correspondingly similar to conventional phase comparators—the phasing of the FB signal—that is applied at the line 7b and supplied to the first input of the phase comparator 4—is compared with that of the CLK signal—that is applied at the line 8 and supplied to the further input of the comparator 4. Depending on whether the phase of the FB signal hurries ahead or runs after that of the CLK signal, the phase comparator 4 outputs—as a control signal for the above-mentioned first delay module 2—an incrementing signal (INC signal) at a control line 9a, or a decrementing signal (DEC signal), and transmits same to the filter 9c.

For example, a "logically high" signal may be applied by the phase comparator 4 to the above-mentioned line 9a as INC signal, and a "logically low" signal as DEC signal (or vice versa).

In a first mode (synchronizing mode) of the clock signal synchronizing device 1—that is, for instance, started immediately after the taking into operation of the semiconductor device—e.g. during the period T1 illustrated in FIG. 3a—the control signals (incrementing signal (INC signal) or decrementing signal (DEC signal)) received from the filter 9c via the line 9a are—via a line 9b—forwarded to the first delay module 2 in an unmodified or substantially unmodified form (cf. e.g. the signals INC' or DEC', respectively, illustrated in FIG. 1) ("inactivated state" of the filter 9c).

The above-mentioned signals (INC (or INC', respectively), and DEC (or DEC', respectively)) result in that the delay $t_{var}$ of the CLK signal which is effected by the first signal delay module 2 is—e.g. by the above-mentioned, not illustrated control device—correspondingly increased or decreased, respectively, e.g. is increased in the case of an INC or INC' signal (cf. e.g. the INC' signal illustrated at the left in FIG. 3a, and the respectively decreasing hurrying ahead of the FB signal vis-à-vis the CLK signal during the above-mentioned period T1 by initially e.g. Δt1, then Δt2, subsequently Δt3, etc. (arrows K, L, M)), or is decreased in the case of a DEC or DEC' signal, respectively, so that finally—here e.g. from a time t4 on—the CLK signal and the FB signal are synchronized, i.e. the clock signal synchronizing device 1 is locked (wherein—as is, for instance, illustrated in FIG. 3a, at the right—the CLK signal has a positive edge A substantially at the same time ta as the FB signal (edge A') (or the CLK signal has a negative edge B substantially at the same time tb as the FB signal (edge B'), respectively).

The clock signal synchronizing device 1 then changes from the above-mentioned first mode ("synchronizing mode") to a second mode (cf. period T2, "locked mode" illustrated in FIG. 3a).

During the above-mentioned first mode ("synchronizing mode") and the above-mentioned second mode ("locked mode"), whenever the positive edge A' of the FB signal hurries ahead the positive edge A of the CLK signal (as is, for instance, illustrated at the left in FIG. 3a), the phase comparator 4 outputs an INC signal at the line 9a as a control signal for the above-mentioned first delay module 2. Contrary to that, whenever the positive edge A' of the FB signal runs after the positive edge A of the CLK signal, the phase comparator 4 outputs a DEC signal at the line 9a as a control signal for the above-mentioned first delay module 2.

If the clock signal synchronizing device 1 changes from the above-mentioned first mode ("synchronizing mode") to the above-mentioned second mode ("locked mode"), the filter 9c is activated (e.g. by means of an activating signal (ACTIVATE signal) output by the phase comparator 4 at a line 9d and supplied to the filter 9c), i.e. changes from the above-mentioned inactivated state to an activated state.

If the clock signal synchronizing device 1 is in the above-mentioned second mode ("locked mode"), i.e. if the filter 9c is in the above-mentioned "activated" state, the filter 9c only transmits the above-mentioned INC or DEC signal received from the phase comparator 4 to the first signal delay module (e.g. in the form of the INC' or DEC' signal applied to the line 9b) when—as will still be explained in detail in the following—in a first sub-mode of the above-mentioned "locked mode" for a particular, first, relatively large number A1 of successive clocks—e.g. defined by the clock signals CLK, BCLK—(e.g. between 8 and 32, in particular between 12 and 20, e.g. 16 successive clocks) (or a first, predetermined, relatively long period, respectively)—the phase comparator 4 outputs one and the same signal (e.g. for 16 successive clocks an INC signal, or for 16 successive clocks a DEC signal), or when—in a second sub-mode of the above-mentioned "locked mode"—for a particular, second, relatively small number A2 of successive clocks—defined, for instance, by the clock signals CLK, BCLK (e.g. between 1 and 8, in particular between 2 and 8, e.g. 4 successive clocks) (or a second, predetermined, relatively short period, respectively)—the phase comparator 4 outputs one and the same signal (e.g. for 4 successive clocks an INC signal, or for 4 successive clocks a DEC signal).

Otherwise—i.e. when the phase comparator 4 does not output (in the above-mentioned first sub-mode of the "locked mode"), for the above-mentioned first number A1, or (in the above-mentioned second sub-mode of the "locked mode") for the above-mentioned second number A2 of clocks, one and the same signal INC or DEC—the filter 9c may—e.g. via a further, not illustrated line—send a hold signal (HOLD signal) to the first delay module 2.

The effect of the HOLD signal is that the delay $t_{var}$ of the CLK signal that is effected by the first signal delay module 2 is kept constant, i.e. is neither increased nor decreased (although a DEC or INC signal is output by the phase comparator 4). By that—in the above-mentioned "locked mode" of the clock signal synchronizing device 1—jitter may be avoided in the clock signal DQS output at the line 6*b* by the clock signal synchronizing device 1, while—from time to time (namely, when the filter device 9*c* outputs an INC' or DEC' signal, respectively (and not a HOLD signal))—resynchronizing of the clock signal DQS with respect to the clock signal CLK is nevertheless ensured.

Whether the system is in the above-mentioned first sub-mode of the above-mentioned "locked mode" (—wherein, only when during the above-mentioned first number A1 of successive clocks (e.g. 16 successive clocks), the phase comparator 4 outputs one and the same signal INC or DEC, the same is correspondingly forwarded by the filter 9*c* to the first delay module 2, or no HOLD signal is output, respectively—), or whether the system is in the above-mentioned second sub-mode of the above-mentioned "locked mode" (—wherein, only when during the above-mentioned second number A2 of successive clocks (e.g. 4 successive clocks), the phase comparator 4 outputs one and the same signal INC or DEC, the same is correspondingly forwarded by the filter 9*c* to the first delay module 2, or no HOLD signal is output, respectively), is—as will be explained in detail in the following—determined by the above-mentioned control device 5.

Figure 3B:
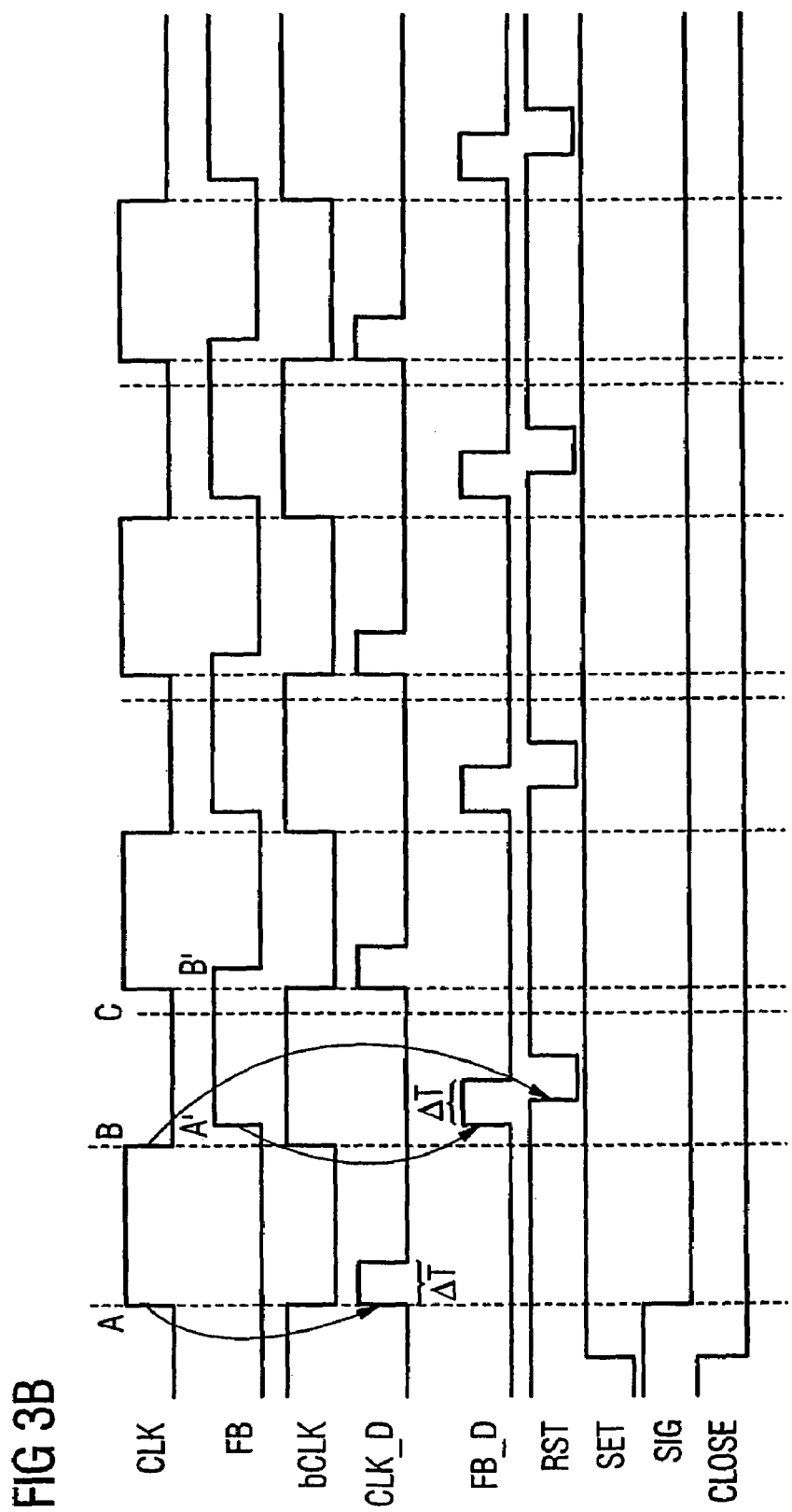
FIG. 3b are time flow diagrams of the FB and CLK signals input into the control device illustrated in FIG. 2, the signals generated in the control device, and the control signal (CLOSE signal) output by the control device and used for controlling the clock signal synchronizing process, with a relatively poor synchronization of the FB and CLK signals.

In so doing, the control device 5 in particular determines whether the rising edges A, A' (or, alternatively, the falling edges B, B') of the CLK and of the FB signal are relatively close to one another with respect to time (which means that—as is, for instance illustrated in FIG. 3—the clock signals CLK and FB are (still) synchronized relatively well), or whether the rising edges A, A' (or, alternatively, the falling edges B, B') of the CLK and of the FB signal are relatively far apart with respect to time (which means that—as is illustrated in FIG. 3*b*—the clock signals CLK and FB are (only) relatively poorly synchronized)—e.g. due to a change in the frequency of the CLK signal, or e.g. a change in the amount of the supply voltage, and, effected thereby, a change in the signal delay time $t_{var}$ caused by the first delay module 2.

If the above-mentioned control device 5 determines that the rising edges A, A' (or, alternatively, the falling edges B, B') of the CLK and of the FB signal are relatively close to one another with respect to time, the control device 5, as is illustrated in FIG. 3*c*, outputs a "logically high" control signal CLOSE at a line 29 and transmits same to the filter 9*c* (which then changes to the above-mentioned first sub-mode of the above-mentioned "locked mode", or remains in this state, respectively) (—wherein, only when during the above-mentioned first, relatively large number A1 of successive clocks, the phase comparator 4 outputs one and the same signal INC or DEC, the same is correspondingly forwarded by the filter 9*c* to the first delay module 2, or no HOLD signal is output, respectively).

This first sub-mode of the second mode ("locked mode") constitutes the default of the second mode ("locked mode") into which the system—after finishing the first mode (synchronizing mode")—(first of all) changes automatically.

If the above-mentioned control device 5 determines that the rising edges A, A' (or, alternatively, the falling edges B, B') of the CLK and of the FB signal are relatively far apart with respect to time, the control device 5, as is illustrated in FIG. 3*b*, outputs a "logically low" control signal CLOSE at the above-mentioned line 29 and transmits same to the filter 9*c* (which then changes to the above-mentioned second sub-mode of the above-mentioned "locked mode", or remains in this state, respectively) (—wherein, only when during the above-mentioned second, relatively small number A2 of successive clocks, the phase comparator 4 outputs one and the same signal INC or DEC, the same is correspondingly forwarded by the filter 9*c* to the first delay module 2, or no HOLD signal is output, respectively).

The effect thereof is that—with a relatively large deviation between the CLK signal and the FB signal (i.e. in the second sub-mode of the above-mentioned "locked mode")—the then relatively large phase difference between the DQS signal and the CLK signal is counteracted relatively more quickly or more frequently, respectively, than with a relatively small deviation between the CLK signal and the FB signal (i.e. in the first sub-mode of the above-mentioned "locked mode"), i.e. with a relatively small phase deviation between the DQS signal and the CLK signal.

This renders it possible that—in the case of a relatively large phase difference between the DQS signal and the CLK signal—the DQS signal and the CLK signal can be synchronized (again) relatively quickly.

FIG. 2 shows a schematic detail representation of the control device 5 used in the clock signal synchronizing device 1 of FIG. 1 for controlling the clock signal synchronizing process, in particular for controlling the filter 9*c*.

As results from FIG. 2, the control device 5 comprises a RS flip-flop 12 with two NAND gates 17*a*, 17*b*, first, second, and third delay module 13*a*, 13*b*, 13*c*, a first and a second AND gate 14*a*, 14*b*, further NAND gates 14*c* and 17*c*, a latch 15, and an inverter 16.

A first input of the (first) AND gate 14*a* is—via a line 20*a*—connected with the above-mentioned line 22 through which the above-mentioned CLK signal is input into the control device 5.

A second input of the (first) AND gate 14*a* is—via a line 20*b*—connected with an output of the above-mentioned (first) delay module 13*a*, the input of which is connected, via a line 20*c*, also to the above-mentioned line 22 through which the above-mentioned CLK signal is input into the control device 5.

As results further from FIG. 2, a first input of the (second) AND gate 14*b* is—via a line 20*d*—connected with an output of the above-mentioned (second) delay module 13*b*, the input of which is connected, via a line 20*e*, to the above-mentioned line 21 through which the above-mentioned FB signal is input into the control device 5.

A second input of the (second) AND gate 14*b* is, via a line 20*f*, also connected with the above-mentioned line 21 through which the above-mentioned FB signal is input into the control device 5.

The output of the first AND gate 14*a* is, via a line 20*g*, connected to a first input of the NAND gate 17*c*, and the output of the second AND gate 14*b* is, via a line 20*h*, connected to a second input of the NAND gate 17*c*.

As results further from FIG. 2, the above-mentioned line 22 is—via a line 20*i*—connected with an input of the inverter 16, the output of which is, via a line 20*k* and a line 20*l* connected therewith, connected to a second input of the (further) NAND gate 14*c*.

A first input of the NAND gate 14*c* is—via a line 20*m*—connected with an output of the above-mentioned (third) delay module 13*c*, the input of which is, via a line 20*n*, connected to the above-mentioned line 20*k*, and thus—also—to the output of the inverter 16.

In accordance with FIG. 2, the output of the inverter 16 is additionally also—via a line 20o connected with the line 20k—connected to a (clock) input of the latch 15.

A first input of the RS flip-flop 12 (or a first input of the first NAND gate 17a thereof, respectively) is—via a line 20p—connected to an output of the above-mentioned (third) NAND gate 17c. The output of the first NAND gate 17a of the RS flip-flop 12 is—via a line 20q and a line 20r connected therewith—fed back to a first input of the second NAND gate 17b of the RS flip-flop 12.

Furthermore, a second input of the second NAND gate 17b of the RS flip-flop 12 is—via a line 20s—connected with the output of the above-mentioned NAND gate 14c.

The output of the second NAND gate 17b of the RS flip-flop 12 is—via a line 20t—fed back to a second input of the first NAND gate 17a of the RS flip-flop 12. An output of the RS flip-flop 12 (here: the output of the first NAND gate 17a) is, via a line 20u connected to the line 20q, connected to a (data) input of the latch 15.

Furthermore, as is illustrated in FIG. 2, the output of the latch 15 is connected to the above-mentioned line 29, so that the control signal (CLOSE signal) output by the control device 5 at the output of the latch 15 can—as has already been explained above and as is illustrated in FIG. 1—be supplied to the filter 9c of the clock signal synchronizing device 1.

The delay modules 13a, 13b, 13c may, for instance, be formed by a single inverter each, or e.g. by a plurality of inverters, e.g. by an odd number of inverters connected in series.

By the delay module 13a, the CLK signal applied at the lines 22, 20c is delayed and supplied to the second input of the AND gate 14a in an inverted form.

Correspondingly similar, the FB signal applied at the lines 21, 20e is delayed by the delay module 13b and is—in an inverted form—supplied to the first input of the AND gate 14.

As results from FIGS. 3b and 3c, the signal CLK_D output at the output of the AND gate 14a will only become "logically high" when both at the first and at the second input of the AND gate 14a a "logically high" signal is applied. This is the case when the CLK signal changes its state from "logically low" to "logically high" (i.e. with a positive edge A of the CLK signal). After a delay ΔT caused by the signal delay time effected by the delay module 13a, the signal CLK_D output at the output of the AND gate 14a changes again to "logically low" (since the signal applied at the second input of the AND gate 14a then changes—delayed by the delay ΔT—its state from "logically high" to "logically low").

Correspondingly similar—as results also from FIGS. 3b and 3c—the signal FB_D output at the output of the AND gate 14b will only become "logically high" when both at the first and at the second input of the AND gate 14b a "logically high" signal is applied. This is the case when the FB signal changes its state from "logically low" to "logically high" (i.e. with a positive edge A' of the FB signal). After a delay ΔT caused by the signal delay time effected by the delay module 13b, the signal FB_D output at the output of the AND gate 14b then changes again to "logically low" (since the signal applied at the first input of the AND gate 14b then changes—delayed by the delay ΔT—its state from "logically high" to "logically low").

In accordance with FIG. 2, the signal CLK_D output at the output of the AND gate 14a is—via the line 20g—supplied to the first input of the NAND gate 17c, and the signal FB_D output at the output of the AND gate 14b is—via the line 20h supplied to the second input of the NAND gate 17c.

The signal SET output at the output of the NAND gate 17c and used as a setting signal for the RS flip-flop 12 will only become "logically low" when both at the fist and at the second input of the NAND gate 17c a "logically high" signal is applied.

This is only the case when—as is illustrated in FIG. 3c—the positive edges A, A' of the CLK signal and of the FB signal are relatively close to one another with respect to time, i.e. the time distance between the positive edges A, A' of the CLK signal and of the FB signal is smaller than or equal to the above-mentioned signal delay time ΔT effected by the delay module 13a or 13b, respectively (which means that—as is, for instance, illustrated in FIG. 3c—the clock signals CLK and FB are (still) synchronized relatively well).

Otherwise—i.e. when, as is illustrated in FIG. 3b, the positive edges A, A' of the CLK signal and of the FB signal are relatively far apart with respect to time, i.e. the time distance between the positive edges A, A' of the CLK signal and of the FB signal is larger than the above-mentioned signal delay time ΔT effected by the delay module 13a or 13b, respectively (which means that—as is, for instance, illustrated in FIG. 3b—the clock signals CLK and FB are synchronized (only) relatively poorly)—the signal SET output at the output of the NAND gate 17c and used as a setting signal for the RS flip-flop 12 remains "logically high".

When the setting signal SET for the RS flip-flop 12 becomes "logically low" (i.e. when the positive edges A, A' of the CLK signal and of the FB signal are relatively close to one another with respect to time), the signal SIG output at the output of the NAND gate 17a of the RS flip-flop 12 and supplied to the (data) input of the latch 15 becomes "logically high".

As results further from FIG. 2, the CLK signal applied at the line 22 is supplied, via the above-mentioned line 20i, to the above-mentioned inverter 16 and—in an inverted form—to the (clock) input of the latch 15 (signal bCLK).

If—as explained above with positive edges of the CLK signal and of the FB signal that are relatively close to one another with respect to time—the signal SIG output at the output of the NAND gate 17a of the RS flip-flop 12 and supplied to the (data) input of the latch 15 becomes "logically high", at the next positive edge of the signal bCLK applied at the (clock) input of the latch 15 (i.e. at the next negative edge of the CLK signal) the control signal CLOSE output at the output of the latch 15 (i.e. at the line 29) becomes "logically high" (this indicating that the positive edges of the CLK signal and of the FB signal are relatively close to one another with respect to time).

As results further from FIG. 2, the signal bCLK output at the output of the inverter 16—and inverted vis-à-vis the CLK signal—is supplied to the input of the delay module 13c and to the second input of the NAND gate 14c.

By the delay module 13c, the bCLK signal applied at the input thereof is delayed and is—in an inverted form—supplied to the first input of the NAND gate 14c.

The signal RST output at the output of the NAND gate 14c, i.e. at the line 20s, and used as a reset signal for the RS flip-flop 12 will only become "logically low" when both at the first and at the second input of the NAND gate 14c a "logically high" signal is applied. This is the case when the bCLK signal changes its state from "logically low" to "logically high"—or, vice versa, the CLK signal changes its state from "logically high" to "logically low"—(i.e. with a negative edge B of the CLK signal). After a delay ΔT caused by the signal delay time effected by the delay module 13c, the signal RST output at the output of the NAND gate 14c changes again to "logically high" (since the signal applied at the first input of the NAND gate 14c then changes—delayed by the delay ΔT—its state from "logically high" to "logically low").

If—as explained above—the RST signal output at the output of the NAND gate 14c, i.e. at the line 20s, becomes "logically low", the RS flip-flop 12 is reset (i.e. the signal SIG output at the output of the RS flip-flop 12, i.e. at the line 20q, becomes "logically low"), so that the control device 5 may—at the next positive edge C of the CLK signal—again determine in accordance with the above statements whether the positive edges A, A' of the CLK signal and of the FB signal are relatively close to one another with respect to time (FIG. 3c), or relatively far apart with respect to time (FIG. 3b).

What is claimed is:

1. A clock signal synchronizing device for synchronizing clock signals comprising:
    a delay module with a variable delay time into which a clock signal is input, is charged with the variably controllable delay time, and is output as a delayed clock signal;
    a phase comparator for comparing the phase of the clock signal, with the phase of the delayed clock signal, or of a signal obtained therefrom, and outputting a first signal when the phase of the clock signal hurries ahead the phase of the delayed clock signal or of the signal obtained therefrom, and a second signal when the phase of the clock signal runs after the phase of the delayed clock signal or of the signal obtained therefrom; and
    a filter for receiving the first and second signals, and for transmitting a control signal to the delay module for varying the delay time of the delay module when for a predetermined number of successive clocks the filter receives the first signal or when for a predetermined number of successive clocks the filter receives the second signal, the predetermined number of successive clocks being greater than one.

2. The device according to claim 1, wherein the first mode of the clock signal synchronizing device is a resynchronizing mode or locked mode, respectively.

3. The device according to claim 1, wherein, when the device determines that a clock edge of the delayed clock signal output by the delay module, or of the signal obtained therefrom, lies within the predetermined time frame before of after a corresponding clock edge of the clock signal, or of the signal obtained therefrom, the control device changes the delay module delay time only when for a first number of successive clocks the phase comparator determines that the phase of the clock signal or of the signal obtained therefrom, hurries ahead or runs after the phase of the delayed clock signal, or of the signal obtained therefrom, and when the device determines that a clock edge of the delayed signal output by the delay module, or of the signal obtained therefrom, lies outside the predetermined time frame before or after a corresponding clock edge of the clock signal, or of the signal obtained therefrom, the control device changes the delay module delay time only when for a second number of successive clocks that differs from said first number the phase comparator determines that the phase of the clock signal, or of the signal obtained therefrom, hurries ahead or runs after the phase of the delayed clock signal, or of the signal obtained therefrom.

4. The device according to claim 3, wherein the second number of clocks is smaller than said first number of clocks.

5. The device according to claim 1, wherein, in a second mode of the clock signal synchronizing device, the control device changes the delay module delay time every time or at each clock, respectively, when the phase comparator determines that the phase of the clock signal, or of the signal obtained therefrom, hurries ahead or runs after the phase of the delayed clock signal, or of the signal obtained therefrom.

6. The device according to claim 5, wherein the second mode of the clock signal synchronizing device is a synchronizing mode.

7. A clock signal synchronizing method, comprising:
    charging a clock signal with a variably controllable delay time, so that a delayed clock signal is obtained;
    comparing the phase of the clock signal, with the phase of the delayed clock signal, or of a signal obtained therefrom, and outputting a first signal when the phase of the clock signal hurries ahead the phase of the delayed clock signal or of the signal obtained therefrom, and a second signal when the phase of the clock signal runs after the phase of the delayed clock signal or of the signal obtained therefrom;
    receiving the first and second signals, and transmitting a control signal to the delay module for varying the delay time of the delay module when for a predetermined number of successive clocks the phase of the clock signal hurries ahead the phase of the delayed clock signal, or of the signal obtained therefrom, or when for a predetermined number of successive clocks the phase of the clock signal runs after the phase of the delayed clock signal, or the signal obtained therefrom, the predetermined number of successive clocks being greater than one.

8. The method according to claim 7, wherein when the clock edge of the delayed clock signal output by the delay module, or of the signal obtained therefrom, lies within the predetermined time frame-before of after a corresponding clock edge of the clock signal, or of the signal obtained therefrom, the delay time changes only when for a first number of successive clocks the phase of the clock signal or of the signal obtained therefrom, hurries ahead or runs after the phase of the delayed clock signal, or of the signal obtained therefrom, and when the clock edge of the delayed signal, or of the signal obtained therefrom, lies outside the predetermined time frame before or after a corresponding clock edge of the clock signal, or of the signal obtained therefrom, the delay time changes only when for a second number of successive clocks that differs from said first number the phase comparator determines that the phase of the clock signal, or of the signal obtained therefrom, hurries ahead or runs after the phase of the delayed clock signal, or of the signal obtained therefrom.

9. The method according to claim 8, wherein the second number of clocks is smaller than said first number of clocks.

* * * * *

UNITED STATES PATENT AND TRADEMARK OFFICE
CERTIFICATE OF CORRECTION

PATENT NO. : 7,230,462 B2  Page 1 of 1
APPLICATION NO. : 10/971762
DATED : June 12, 2007
INVENTOR(S) : Rao et al.

It is certified that error appears in the above-identified patent and that said Letters Patent is hereby corrected as shown below:

| | |
|---|---|
| Column 2, line 42: | Insert --of-- between "ahead" and "or"; |
| Column 2, line 46: | Replace "result" with --results--; |
| Column 3, line 16: | Insert --a-- before the first occurrence of "delay"; |
| Column 3, line 54: | Replace "are time flow diagrams" with --is a time flow diagram--; |
| Column 3, line 57: | Replace "are time flow diagrams" with --is a time flow diagram--; |
| Column 3, line 64: | Replace "are time flow diagrams" with --is a time flow diagram--; |
| Column 5, line 40: | Insert --of-- between "ahead" and "or"; |
| Column 8, line 30: | Replace "module" with --modules--; |
| Column 10, line 6: | Replace "fist" with --first--; |
| Column 11, line 28: | Insert --of-- after "ahead"; |
| Column 11, line 48: | Replace "of after" with --or after--; |
| Column 11, line 53: | Insert --of-- between "ahead" and "or"; |
| Column 12, line 2: | Insert --of-- between "ahead" and "or"; |
| Column 12, line 12: | Insert --of-- between "ahead" and "or"; |
| Column 12, line 21: | Replace "signal,or" with --signal, or--; |
| Column 12, line 22: | Replace "first,signal" with --first signal--; |
| Column 12, line 23: | Insert --of-- between "ahead" and "the"; |
| Column 12, line 32: | Insert --of-- between "ahead" and "the"; |
| Column 12, line 42: | Replace "of" with --or--; |
| Column 12, line 46: | Insert --of-- between "ahead" and "or"; |
| Column 12, line 56: | Insert --of-- between "ahead" and "or". |

Signed and Sealed this

Second Day of October, 2007

JON W. DUDAS
*Director of the United States Patent and Trademark Office*